(12) United States Patent
Adachi et al.

(10) Patent No.: US 6,981,881 B2
(45) Date of Patent: Jan. 3, 2006

(54) SOCKET AND CONTACT OF SEMICONDUCTOR PACKAGE

(75) Inventors: Kiyoshi Adachi, Hiratsuka (JP); Masanori Yagi, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/488,716

(22) PCT Filed: Oct. 2, 2002

(86) PCT No.: PCT/US02/31443

§ 371 (c)(1),
(2), (4) Date: Mar. 3, 2004

(87) PCT Pub. No.: WO03/031994

PCT Pub. Date: Apr. 17, 2003

(65) Prior Publication Data

US 2005/0070135 A1    Mar. 31, 2005

(30) Foreign Application Priority Data

Oct. 5, 2001    (JP)    ............................. 2001-309954

(51) Int. Cl.
*H05K 1/00*    (2006.01)
(52) U.S. Cl. ...................................................... 439/71

(58) Field of Classification Search .................. 439/66, 439/71, 91, 591, 571
See application file for complete search history.

(56) References Cited

U.S. PATENT DOCUMENTS 5,324,205 A * 6/1994 Ahmad et al. ................ 439/66
5,611,705 A * 3/1997 Pfaff ........................... 439/266

* cited by examiner

*Primary Examiner*—Briggitte R. Hammond
(74) *Attorney, Agent, or Firm*—Robert J. Zeitler

(57) ABSTRACT

The present invention is directed to a socket connector (TS) having a plurality of contacts to be brought into contact with a plurality of solder balls (S) of a semiconductor package, a socket body (15) in which a mounting hole (11) is provided for each contact (10), a through-hole pierced in a height direction of the socket body and a contact support hole (13) are provided. Each contact (10) is provided with an upright piece (101) extending through the through-hole, a support piece extending from a proximal end side of the upright piece to be inserted into the through-hole and a contact portion (103) formed at a free end portion of the upright piece to be brought into contact with the solder ball. Each contact portion is arranged at a height level such that it projects from the surface of the socket body. A guide projection (14) is provided at a position to face an associated contact portion of each contact. These contact portion and guide projection are set at an interval such that the solder ball may be brought into contact with the both.

20 Claims, 14 Drawing Sheets

PRIOR ART

SOCKET AND CONTACT OF SEMICONDUCTOR PACKAGE

FIELD OF THE INVENTION

The present invention relates to a socket of a semiconductor package provided with a plurality of contacts to be brought into contact with a plurality of solder balls arranged on one side of the semiconductor package, and such contacts.

BACKGROUND OF THE INVENTION

Recently, the reduction of a pitch of integrated circuits has been advancing due to the demand of miniaturization of information processing equipment and high-speed performance thereof. In accordance with this, the actual mounting system is changing from a through-hole type to a surface mounting type and the arrangement of terminals is changing from a peripheral arrangement to an array arrangement. Furthermore, of such array arrangements, a ball grid array (BGA) in which solder balls are arranged in an array-like arrangement on a surface of a package is becoming a main type of a package on which the terminals may be mounted on the surface.

In the case where a socket is used between a BGA type integrated circuit and a substrate, in some cases, the socket may be actually mounted on the substrate for interchanging the integrated circuits in addition to the case where the integrated circuits are subjected to a burn-in test or a high frequency test by using a test socket. In the socket, it is necessary to positively contact all the contacts with both terminals of the integrated circuits and terminals formed on the substrate to keep a sufficient electrical conductivity.

On the other hand, it is required to reduce the inductance with respect to a higher speed clock as the density or the operational speed of the integrated circuit is increased. In order to meet this requirement, it is necessary to make a path length of current in contacts (interval between contact portions), which are interposed between the terminals of the integrated circuit and the terminals of the substrate, as small as possible.

Conventionally, for example, a socket of a semiconductor package having a plurality of solder balls arranged in an array is disclosed in Japanese Patent Application Laid-Open No. Hei 8-222335.

The socket 300 of the publication is provided with a contact 305 as shown in FIGS. 12 to 14. This contact 305 is formed by punching a metal plate out and is provided with a base body 302 having side walls 301 on both sides and having a substantially U-shaped cross-section, a substantially C-shaped contact piece 303 having elasticity, projecting toward the side walls 301 from a lower portion of the body 302 and extending above the body 302, a contact portion 303a provided in the vicinity of a tip end of the contact piece to be brought into contact with a solder ball S of an IC package 400, and a contact portion 304 projecting from the lower end portion of the body 302 in a direction opposite to that of the contact piece 303.

In this test socket, in order that the solder ball S pressingly contacts the contact portion 303a, the contact piece 303 is formed into a leaf spring having an arcuate shape. For this reason, it is difficult to shorten the length of an electric path from the contact portion 303a to the contact portion 304. Thus, it is impossible to decrease the self-inductance. This causes a problem that the test or evaluation of the semiconductor package could not be performed with high precision in a high frequency range. Also, since most part of the one side of the contact piece 303 is pressingly contacted against the inner wall of a pressing inlet, it is difficult to elastically deform the contact.

In an attempt to solve this problem, the socket shown in FIG. 15 is known. A contact 310 formed substantially into a U-shape is press-fit and fixed to the socket body 311, and the portion of upright piece 313 except for a fixture region 312 can be elastically deformed. Thus, when the contact portions 314 are brought into contact with the solder ball 315, the upright pieces 313 are elastically deformed so as to avoid damaging the solder ball 315. Furthermore, a height (thickness) of the socket can also be reduced.

However, there are problems to be solved as described below. Namely, these are problems associated with the requirement of further reduction of height of the socket. In the socket shown in FIG. 15, the length of the upright piece 313 that may be elastically deformed is shortened due to the existence of the fixture region 312. For this reason, there is a problem that it is difficult to further reduce the height thereof. Furthermore, since a maximum dimension of the contact 310 is elongated, it is impossible to further reduce the inductance.

In particular with respect to the reduction in height of the socket, if the portion of the upright piece 313 that may be elastically deformed is shortened due to the further reduction in height of the socket, the elasticity is degraded so that the load imposed on the solder ball 315 is increased to cause the problem of damaging the solder ball 315.

As a technique for reducing the height of the socket, there is a contact sheet described in Japanese Patent Application Laid-Open No. 2001-167857, in which a contact spring is formed by a plurality of cantilevers having spherical terminal holding portions.

In the contact sheet described in the publication, since all the cantilevers are arranged on a planar surface with respect to the sheet, it is possible to ensure the advantage of the further reduction in height but there is a problem that the arrangement thereof at a high density is impossible. Namely, since the plurality of cantilevers are laid horizontally on the planar surface, the area occupied by one contact spring is increased. As a result, the high density arrangement is impossible.

Also, conventionally, since the shape of the contact itself is complicated and a plurality of cantilevers are used for one spherical terminal, there is the problems that the assembling work takes long time and the cost is increased.

OBJECT AND SUMMARY OF THE INVENTION

An object of the present invention is to provide a socket of a semiconductor package, which may reduce self-inductance and enables high-density arrangement by reducing the height of the socket, and which also takes into consideration reduction of the cost and the contact reliability of a contact portion.

The present invention adopts the following structure in order to solve the above-described problems. A socket of a semiconductor package according to the present invention is provided with a plurality of contacts to be brought into contact with a plurality of solder balls arranged on one side of the semiconductor package, and a socket body in which a plurality of mounting holes are provided for mounting the respective contacts. Each mounting hole is provided with a through-hole pierced in a height direction of the socket body and a contact support hole. Each contact is provided with an upright piece extending through the through-hole, a support piece extending from a proximal end side of the upright piece to be inserted into the through-hole and a contact portion formed at a free end portion of the upright piece to be brought into contact with the solder ball. Each contact portion is arranged at a height level such that it projects from the surface of the socket body. A guide projection is provided on the surface of the socket body at a position to face an associated contact portion of each contact. These contact portion and guide projection are set at an interval such that the solder ball may be brought into contact with both the contact portion and the guide projection.

According to the present invention, the mounting hole of the contact is provided with the through-hole and the support hole, and the contact is provided with the upright piece extending along the through-hole and the support piece extending from the upright piece to be inserted into the support hole. Accordingly, the upright piece is supported to the support piece so that it may be elastically deformed. As a result, it is possible to effectively utilize the full length of the upright piece as a portion that may be elastically deformed. Thus, it is possible to reduce the self-inductance by the further reduction in height of the socket. Also, since the upright piece extends along the through-hole, it is possible to realize high-density arrangement in comparison with the case where the contacts are arranged in a horizontal manner. Also, the guide projections are provided at a position to face the contact portion of each contact on the top surface of the socket body. The contact portions and the guide projections are set at an interval such that one solder ball may be brought into contact with both the contact portion of the contact and the guide projection. Since the guide projections are formed on the socket body, the contact itself can be formed of one simple construction, and thus it is possible to reduce the cost.

It is preferable that the above-described through-hole is set to a size such that the upright piece may be shifted within its interior. Thus, since the upright piece can be shifted within the interior of the through-hole, it allows freedom as to, rather than restricts, the movement of the upright piece as a whole to thereby enhance the independency of the upright piece. Thus, it is possible to form a contact that is durable by using the length of the effective spring portion as the full length of the upright piece.

It is preferable that a slant surface having a downward gradient toward the through-hole is formed in the above-described guide projection and the surface of the contact portion of the contact is formed into a curved surface extending in a direction moving further away from the slant surface as it extends toward the free end of the upright piece. In the case where the slant surface and the curved surface are thus provided, these become the guide surfaces that smoothly guide the solder ball to the desired relative position. In particular, since the curved surface of the contact portion of the contact can be easily slid by the solder ball that is spherical, it is possible to achieve contact with a low frictional force. Thus, it is possible to realize the enhancement of the reliability of the contact and the reduction of the load on the solder ball.

It is preferable that a pull-off preventing projection for preventing pull-off from the support hole is provided on the support piece. It is possible to fix the support piece securely to the support hole by the pull-off preventing projection.

It is preferable that the socket body is formed into a planar shape, the contact portion of each contact is arranged on its surface side, the proximal end portion of each contact is arranged on the substrate mounting surface side and each proximal end portion projects from the substrate mounting surface. With such an arrangement, since the proximal end of each contact projects from the substrate mounting surface of the socket body, it is possible to directly utilize the proximal end portion as a terminal. For example, it is possible to take a structure in which the socket is arranged on the circuit substrate and the proximal end portion of each contact is brought into contact with the terminal provided on the surface of the circuit substrate. Thus, it is possible to effectively utilize the full length of the upright piece. This also contributes to the reduction in height.

It is possible to take a structure in which a recess portion having a uniform depth is provided on the top surface side of the socket body and the contact portion of each contact is exposed within the recess portion. The recess portion is provided on the top surface side of the socket body so that the contact portion of each contact is exposed to thereby impart a large degree of freedom to the movement of each contact portion. As a result, it is possible to make the through-hole smaller.

It is preferable that a U-shaped curved portion is formed between the upright piece and the support piece of the contact. The U-shaped curved portion exhibits the effect of making the upright piece elastically deformable and also the effect of making the support piece substantially in parallel with the upright piece. Thus, it is possible to achieve a structure to facilitate the mounting of the support piece to be inserted into the support hole.

On the other hand, a contact according to the present invention for being mounted on a socket body to be brought into contact with a plurality of solder balls arranged on one surface of a semiconductor package may be formed by machining a conductive metal plate and provided with an upright portion having contact portions to be brought into contact with solder balls at a free end portion, a support piece extending from a proximal end side of the upright piece so that the upright piece is supported to a socket body, and a U-shaped curved portion provided between the support piece and the upright piece.

According to the contact of this invention, there are provided the upright piece and the support piece. The support piece extends from the proximal end side of the upright piece. Accordingly, the upright piece is supported to the support piece to be elastically deformable. As a result, it is possible to effectively utilize the full length from the free end to the proximal end of the upright piece as a portion that may be elastically deformed. Thus, it is possible to reduce the self-inductance by the further reduction in height of the socket. Since the U-shaped curved portion is formed between the support piece and upright piece, the upright piece is supported by the support piece so as to be elastically deformable and at the same time, the interval between the support piece and the upright piece is kept.

It is preferable that the above-described contact portion is formed to be a curved surface extending in a direction moving further away from the solder ball as it extends toward the free end of the upright piece. Since the curved surface of the contact portion can be easily slid by the solder ball that is spherical, it is possible to achieve contact with a low frictional force. Thus, it is possible to realize the enhancement of the reliability of the contact and the reduction of the load on the solder ball.

It is possible to take a structure in which the upright piece is provided with a reaction piece, the reaction piece is formed between the contact portion curved in an inverted U-shape and the free end of the upright piece, and the free end is in contact with and supported to the socket body to thereby generate reaction force in the reaction piece. With such an arrangement, it is possible to enhance the contact force of the contact portion with respect to the solder ball.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
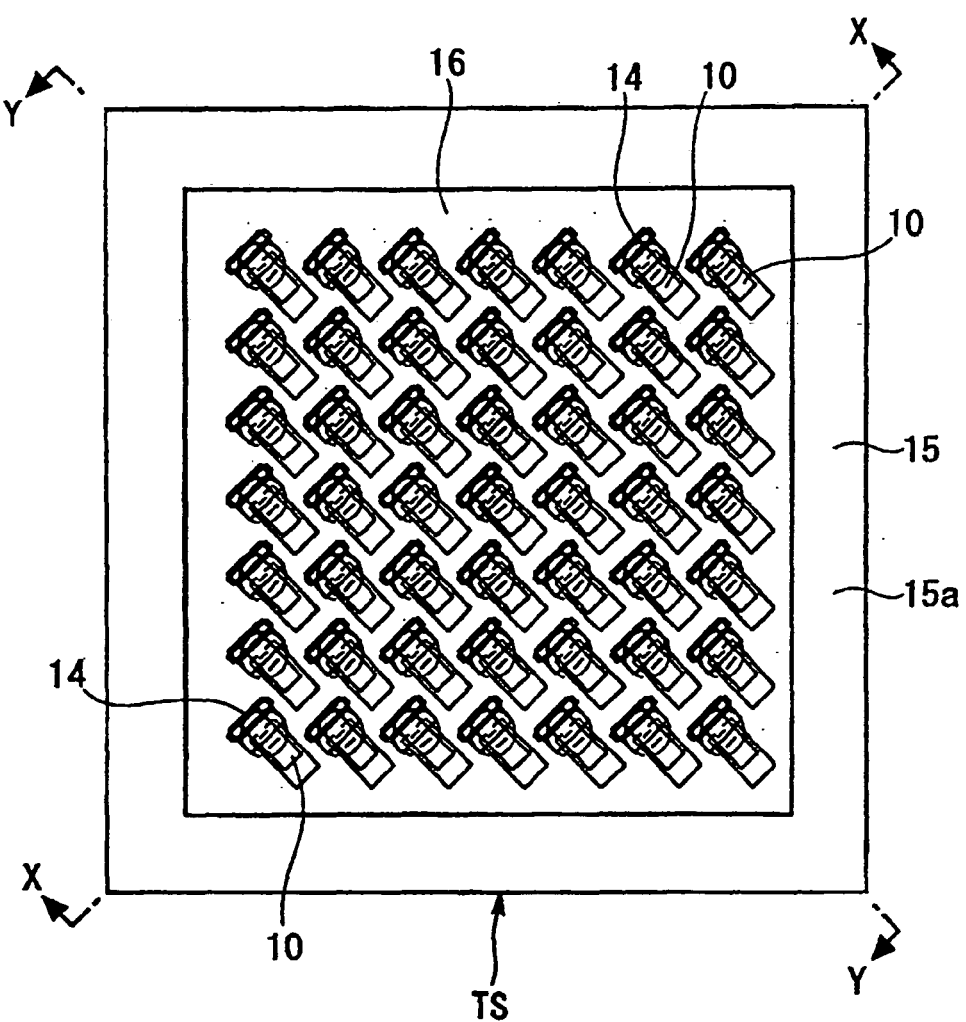
FIG. 1 is a plan view of a test socket in accordance with the present invention.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

Figure 2:
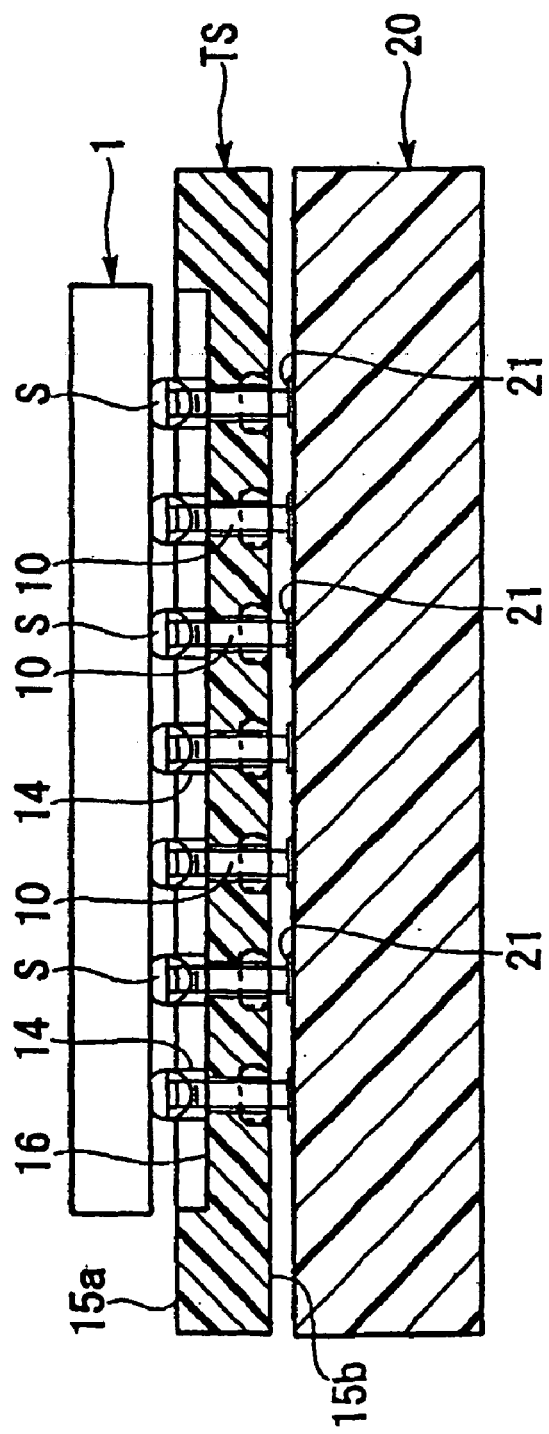
FIG. 2 is a cross-sectional view taken along the line X—X of FIG. 1.
Figure 3:
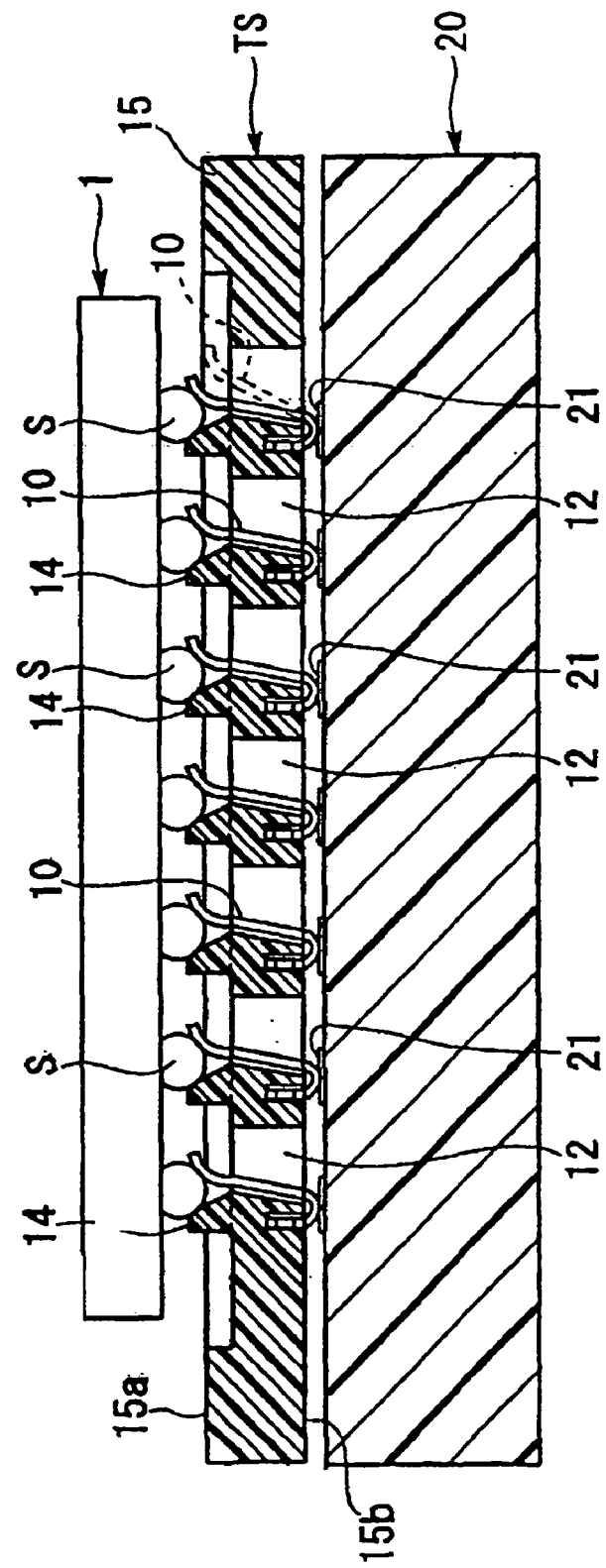
FIG. 3 is a cross-sectional view taken along the line Y—Y of FIG. 1.
Figure 4:
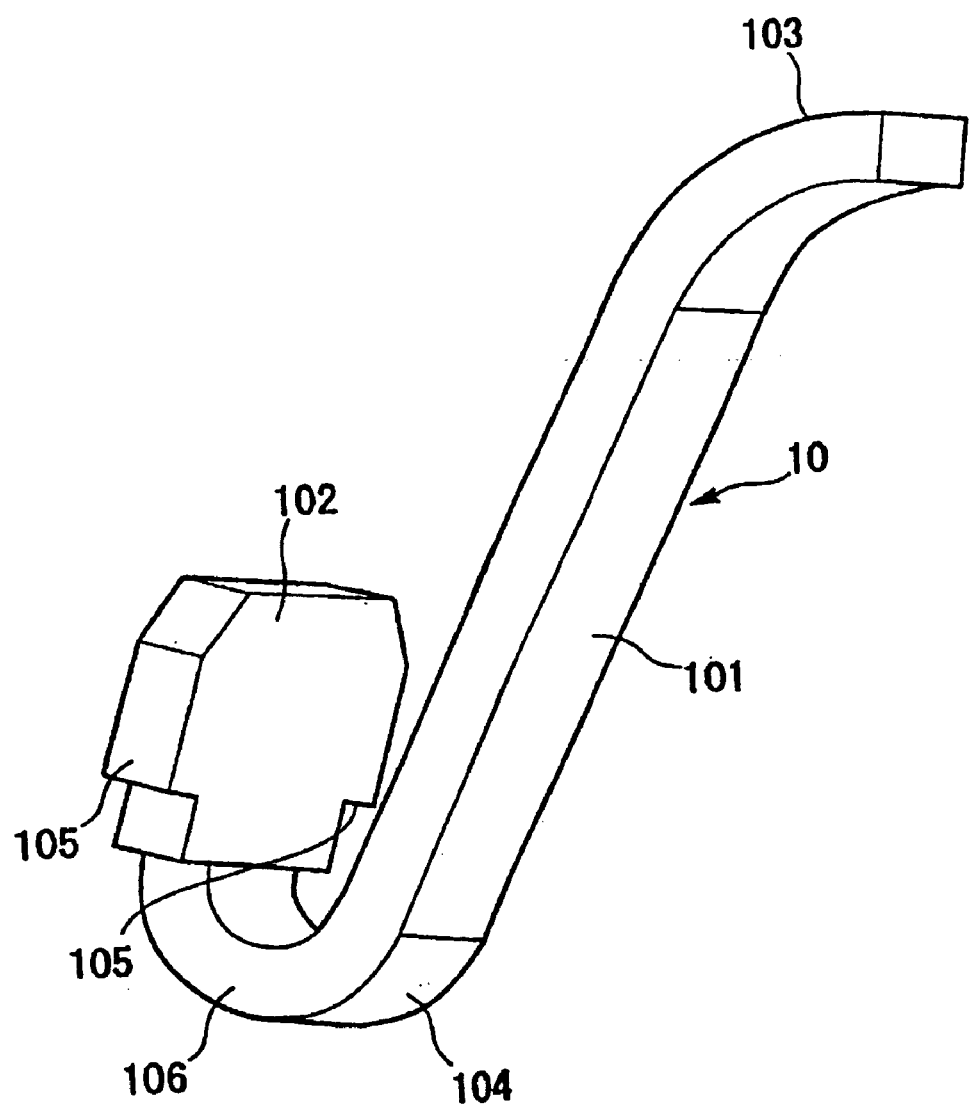
FIG. 4 is an enlarged perspective view of the contact according to the present invention.

FIG. 1 is a plan view of a socket (test socket) of a semiconductor package in accordance with the embodiment of the present invention. FIG. 2 is a cross-sectional view taken along the line X—X of FIG. 1. FIG. 3 is a cross-sectional view taken along the line Y—Y of FIG. 1. FIG. 4 is an enlarged perspective view of a contact.

The test socket TS shown in these drawings is a BGA (Ball Grid Array) testing and evaluating socket of a semiconductor package 1 having a plurality of solder balls S arranged in an array on its one surface (bottom surface) side.

This test socket TS is provided with a plurality of contacts 10 arranged in an array, in a manner corresponding to the arrangement of the solder balls S of the semiconductor package 1, and a socket body (housing) 15 provided with a plurality of mounting holes 11 to which the respective contacts 10 are mounted. The mounting holes 11 are provided with through-holes 12 pierced in a height direction of the socket body 15 and support holes 13 for the contacts 10. The support holes 13 are independently provided next to the through-holes 12 and opened on a substrate mounting surface 15b of the socket body 15.

Then, each contact 10 is provided with an upright piece 101 extending along the through-hole 12 and a support piece 102 extending from the upright piece 101 to be inserted into the support hole 13. A contact portion 103 to be in contact with the solder ball S is formed at a free end (an upper end portion) of the upright piece 101. The support piece 102 extends from a proximal end (a lower end portion) of the upright piece 101.

Each contact portion 103 is arranged at a height level such that it projects from the surface 15a of the socket body 15. A guide projection 14 is provided on the surface 15a of the socket body 15 at a position facing the contact portion 103 of each contact 10. These contact portions 103 and guide projections 14 are set at an interval such that the solder balls S are in contact with the both.

A slant surface 141 having a downward inclination toward the through-hole is formed in each guide projection 14. The surface of the contact portion 103 disposed at a position to face this slant surface 141 is formed into a curved surface extending in a direction moving further away from the slant surface 141 as it extends toward the free end (upper end) of the upright piece 101. More specifically, it is formed into an arcuate surface that expands toward the slant surface 141.

The contact portion 103 whose surface is curved and the slant surface 141 are thus provided to thereby attain the effect such that they serve as guide surfaces for guiding the solder ball S smoothly to the desired relative position. In particular, since the curved surface of the contact portion 103 can be easily slid by the solder ball S having a spherical surface, it enables contact with a low frictional force. Thus, it is possible to attain enhancement of the reliability of the contact and the low load contact with the solder ball S.

Figure 6:
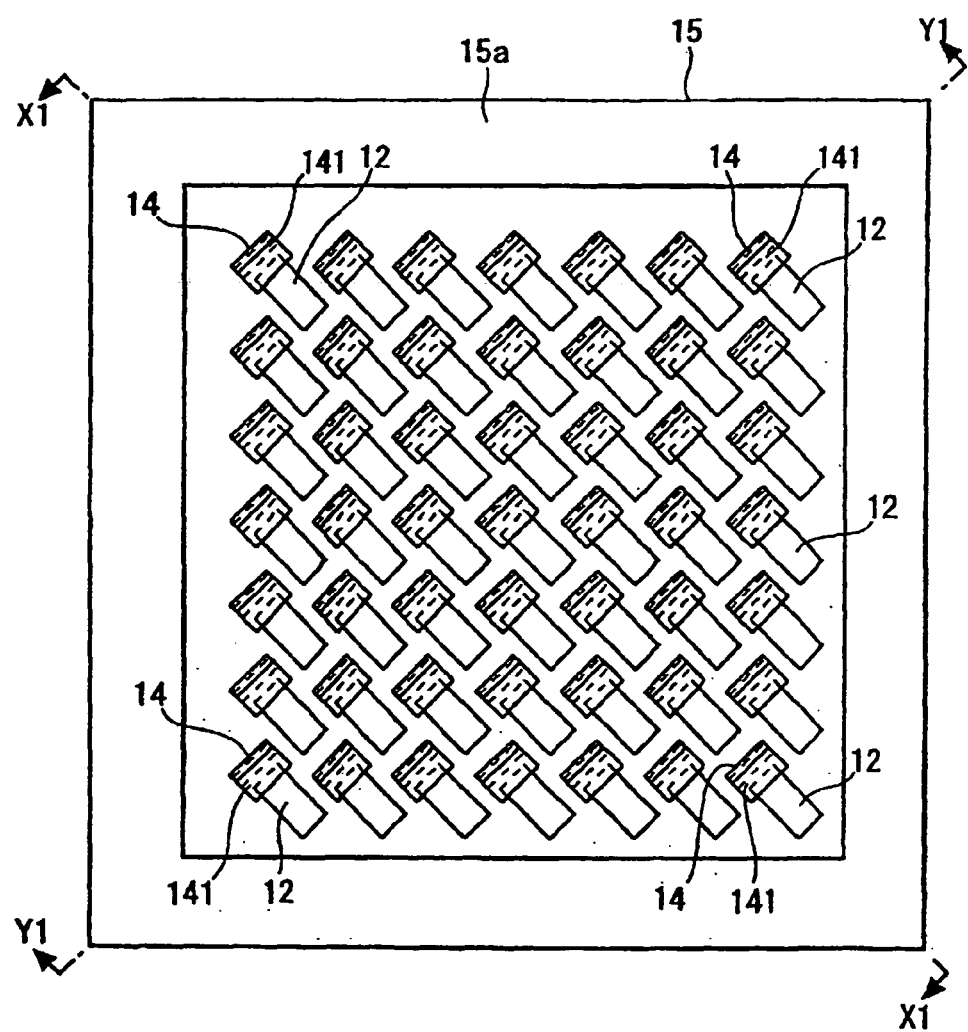
FIG. 6 is a plan view of the socket body in accordance with the present invention.
Figure 7:
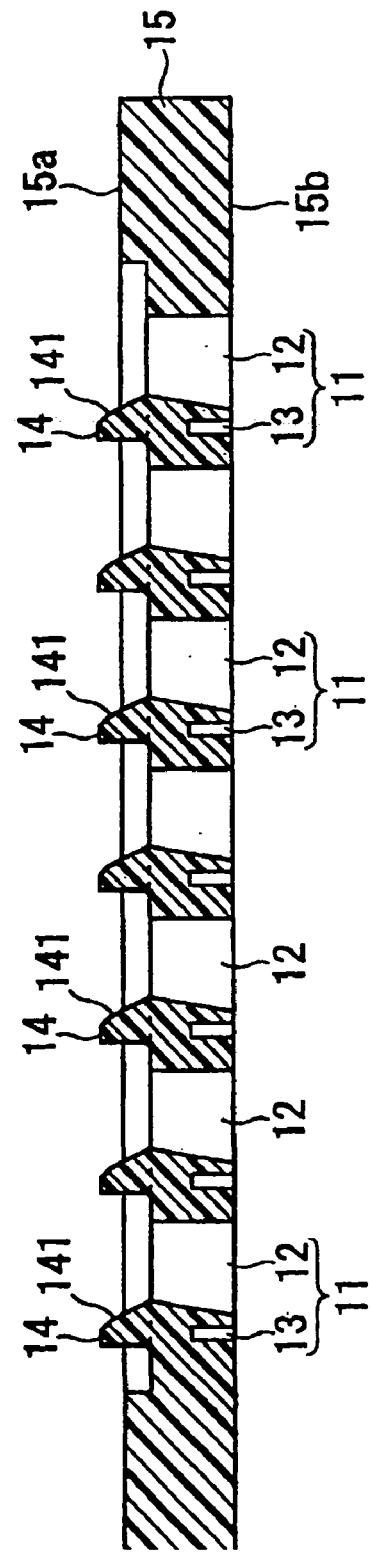
FIG. 7 is a cross-sectional view taken along the line X1—X1 of FIG. 6.
Figure 8:
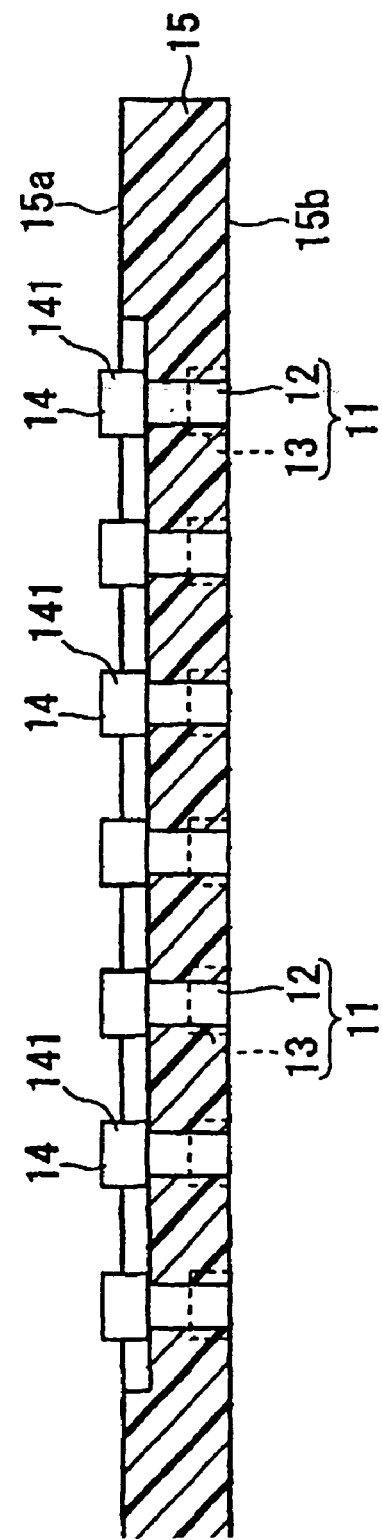
FIG. 8 is a cross-sectional view taken along the line Y1—Y1 of FIG. 6.

With respect to the through-hole 12 of the mounting hole 11, it is set to such a size that the upright piece 101 may be shifted within its interior. Namely, as shown in FIGS. 6 to 8, the shape of the through-hole 12 itself is formed to be much larger than the cross-sectional shape of the upright piece 12. In the disclosed embodiment, it is formed in a planar rectangular shape. The upright piece 101 is adapted to be readily shifted within the interior of the through-hole 12, thereby allowing freedom as to, rather than restricting, the movement of the upright piece 101 as a whole in order to enhance the independency of each upright piece 101.

Thus, it is possible to form the contact that has high durability by using the full length of the upright piece 101 as a length of an effective spring portion. Also, thus, the elasticity of the spring is increased whereby, upon contact with the solder ball S, the load on the solder ball S is reduced and at the same time, it is possible to cope with the non-uniformity in heights of the solder balls in the thickness direction (height direction) of the socket body 15.

Pull-off preventing projections 105 for preventing pull-off from the support hole 13 are provided on the support piece 102. The support piece 102 can be reliably secured to the support hole 13 by the pull-off preventing projections 105 and at the same time it is possible to readily mount the support piece 102 to the support hole 13, thus contributing also to the ease of manufacture.

As shown in FIGS. 6 to 8, the socket body 15 is formed into a planar shape of synthetic resin having insulating properties. The contact portion 103 of each contact 10 is arranged on the side of the surface 15a thereof (see FIG. 9). The proximal end portion 104 of the contact 10 is arranged on the side of the substrate mounting surface 15b (see FIG. 10). Each proximal end portion 104 projects from the substrate mounting surface 15b.

Namely, the proximal end portion 104 of the contact 10 is caused to project from the substrate mounting surface 15b of the socket body 15 to thereby enable direct use of the proximal end portion 104 as a terminal. In this case, the test socket TS is arranged on the circuit substrate 20 so that the proximal end portion 104 of each contact 10 is brought into contact with the terminal 21 provided on the surface of the circuit substrate 20. Thus, it is possible to effectively utilize the full length of the upright piece 101. This also contributes to the reduction in height.

A recess portion 16 having a uniform depth is provided on the surface 15a of the socket body 15, and at least the contact portion 103 of each contact 10 is exposed in the recess portion 16. The recess portion 16 is provided on the side of the surface 15a of the socket body 15 to thereby expose the contact portion 103 of each contact 10 and to make it possible to impart a greater degree of freedom as to the movement of each contact portion 103. As a result, it is possible to make the through-hole smaller.

Figure 5:
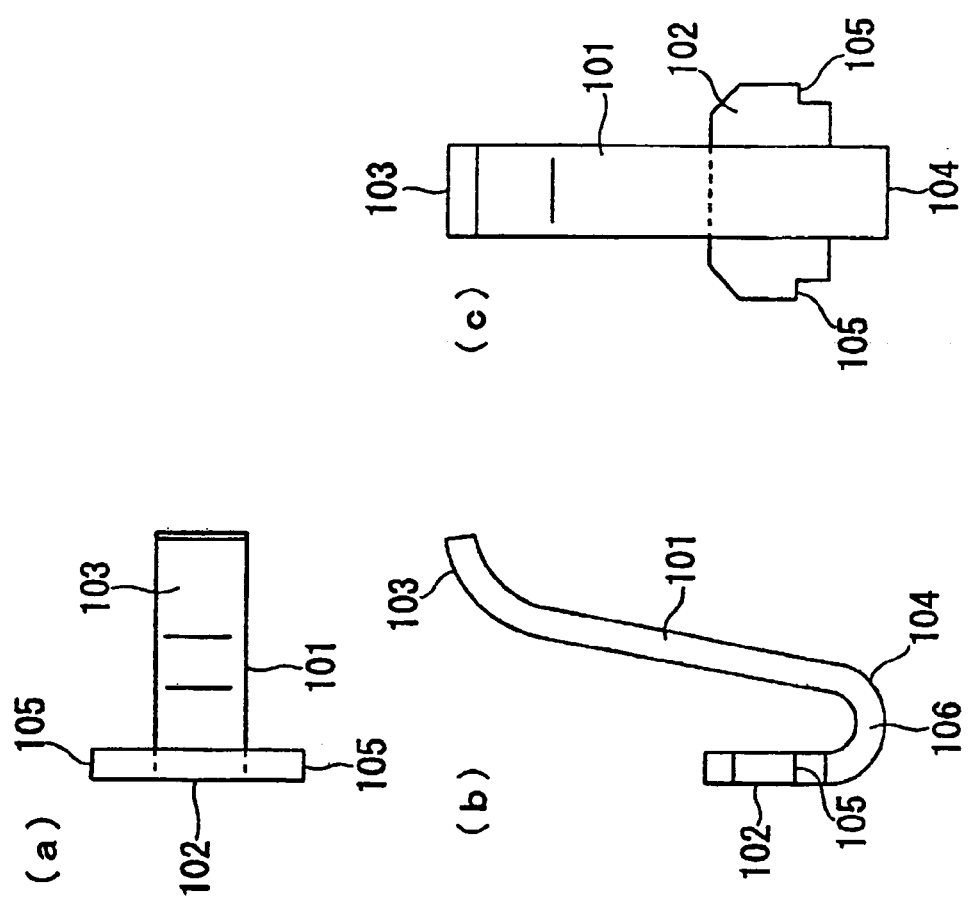
FIG. 5 is a view of the contact according to the present invention, in which (a) is a plan view, (b) is a frontal view, and (c) is a right side elevational view thereof.

As shown in FIGS. 4 and 5, a curved portion 106 that is curved into a U-shape is formed between the upright piece 101 and the support piece 102 of the contact 10. This curved portion 106 is adapted to enable elastic deformation of the upright piece 101 as well as to make the support piece 102 substantially in parallel with the upright piece 101. In this case, the manner in which the upright piece 101 is elastically deformed includes a case where, for example, the contact portion 103 is shifted in the horizontal or vertical direction in the case where the upright piece 101 per se is curved.

The interval between the support hole 13 and the through-hole 12 in the substrate mounting surface 15b of the socket body 15 is set to be smaller than the interval between the upright piece 101 and the support piece 102. The reason why such interval is set is that the degree of freedom of the upright pieces 101 is enhanced by avoiding contact of the upright piece 101 with the inner wall of the through-hole 12.

Since the solder ball S is spherical, when the contact portion 103 arranged to face the slant surface 141 is brought into contact with the solder ball S, the contact portion is subjected to the effect of moving away from the slant surface 141 due to the elasticity of the upright piece 101. Under this condition, the contact portion 103 has a natural reactive force that seeks to cause the contact portion 103 to approach the slant surface 141. Thus, it is possible to enhance the reliability of ensuring contact of the contact portion 103 with the solder ball S by utilizing the elasticity of the contact.

Figure 10:
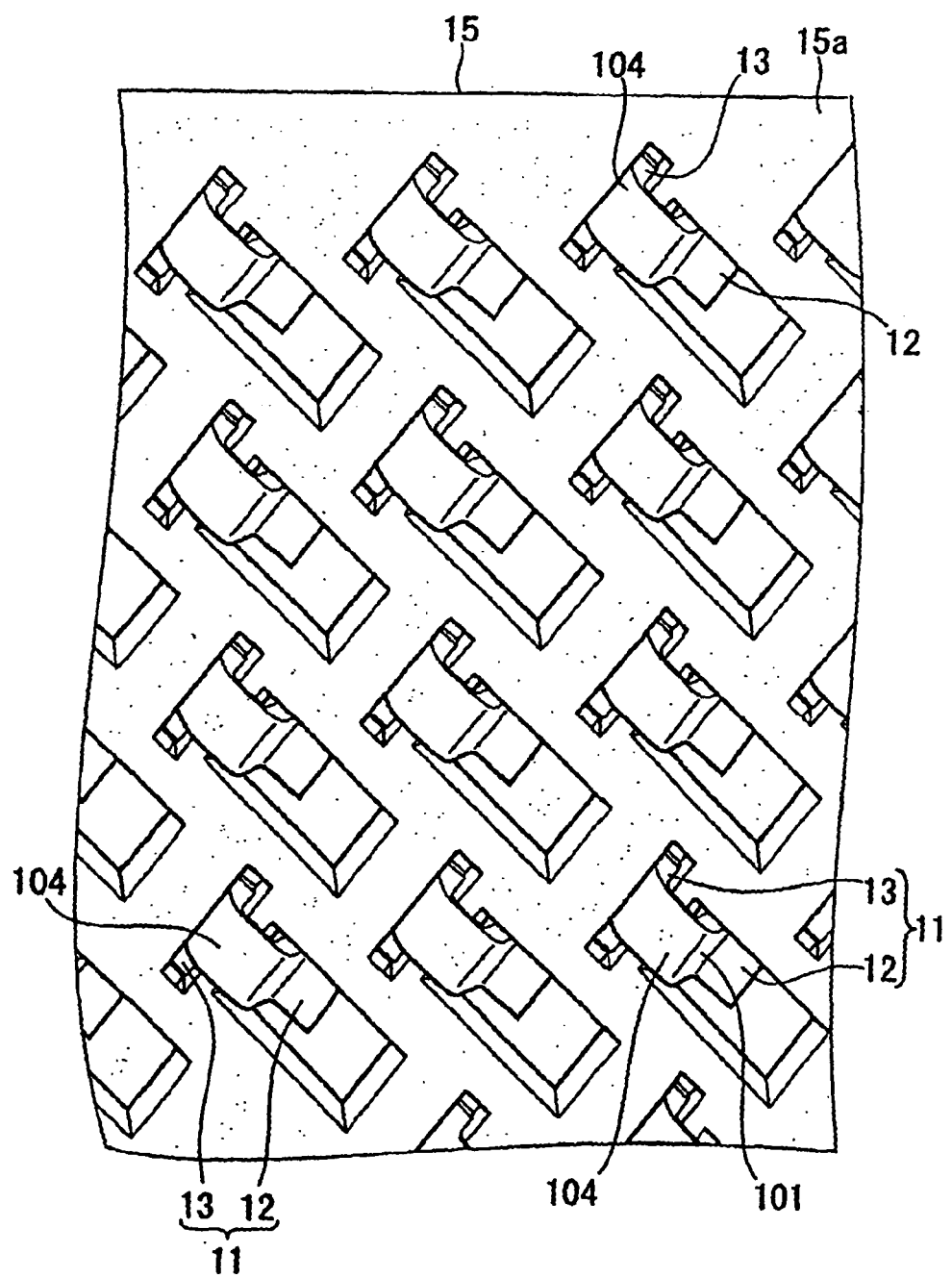
FIG. 10 is a perspective view of a substrate mounting surface side of the test socket according to the present invention.

As shown in FIG. 10, under the condition in which each contact 10 is mounted within the associated mounting hole 11, the proximal end portion 104 of each contact 10 somewhat projects from the substrate mounting surface 15b of the socket body 15 to form the contact portion with the terminal 21 of the circuit substrate 20.

In this embodiment, since support pieces 102 are press-fit into the support hole 13 when the contacts 10 are mounted in the mounting holes 11 of the socket body (housing) 15, the upright pieces 10 may be somewhat shifted up and down. Thus, it is possible to absorb the non-uniformity of the positions of the proximal end portions (tails) 104 forming the contact portions with the circuit substrate 20.

Figure 9:
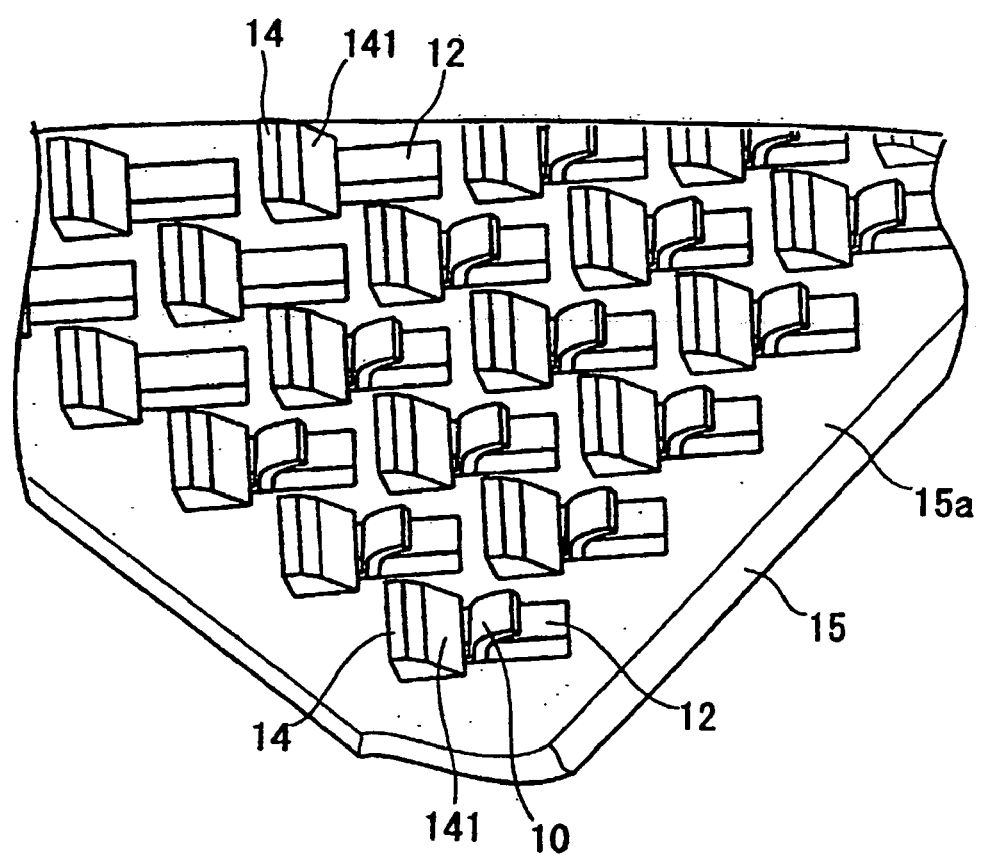
FIG. 9 is a partial perspective view of the test socket according to the present invention.

Incidentally, FIGS. 9 and 10 are perspective views of the test socket TS under the condition in which the contacts 10 are mounted to all the mounting holes 11 of the socket body 15. Out of these, FIG. 10 is a perspective view showing the substrate mounting surface side for the sake of ease of understanding.

Figure 11:
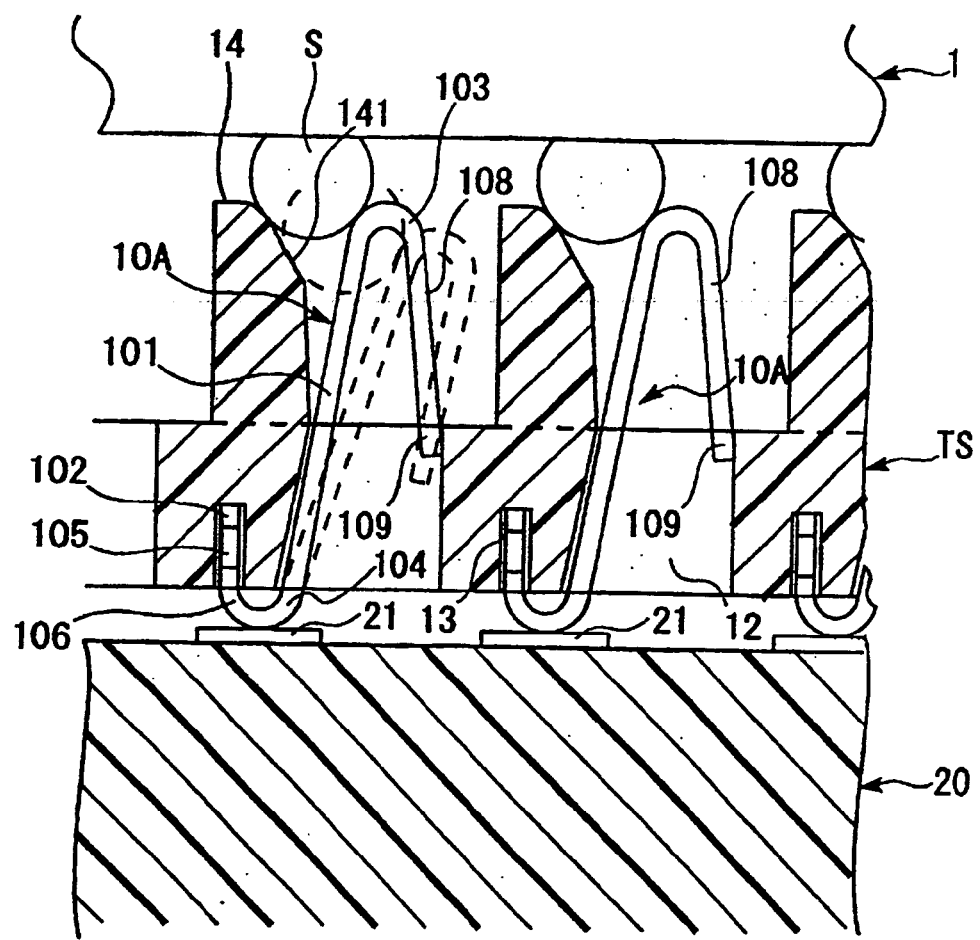
FIG. 11 is a partially enlarged cross-sectional view of a test socket in accordance with another embodiment of the present invention.
Figure 12:
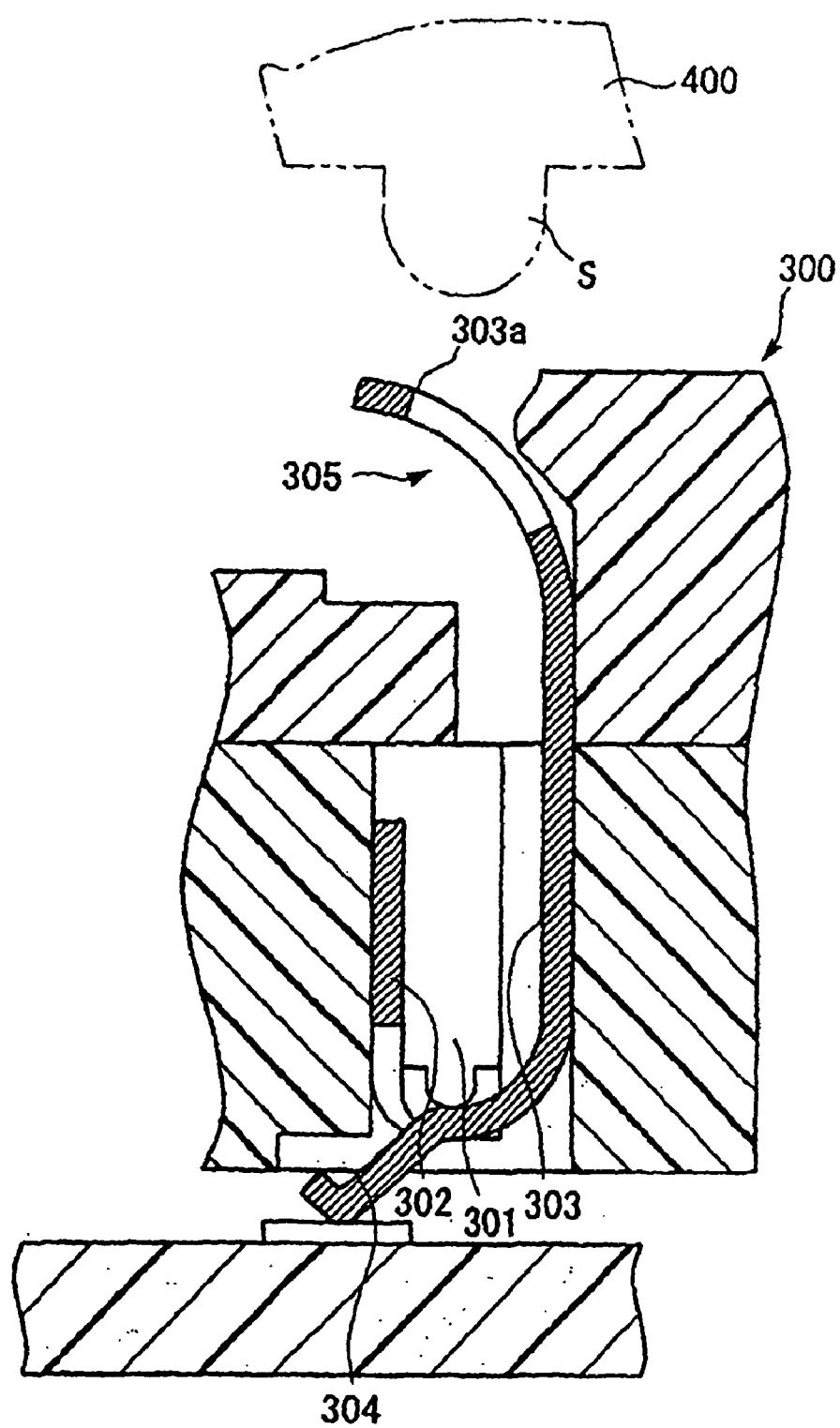
FIG. 12 is a cross-sectional view illustrating a conventional test socket.
Figure 13:
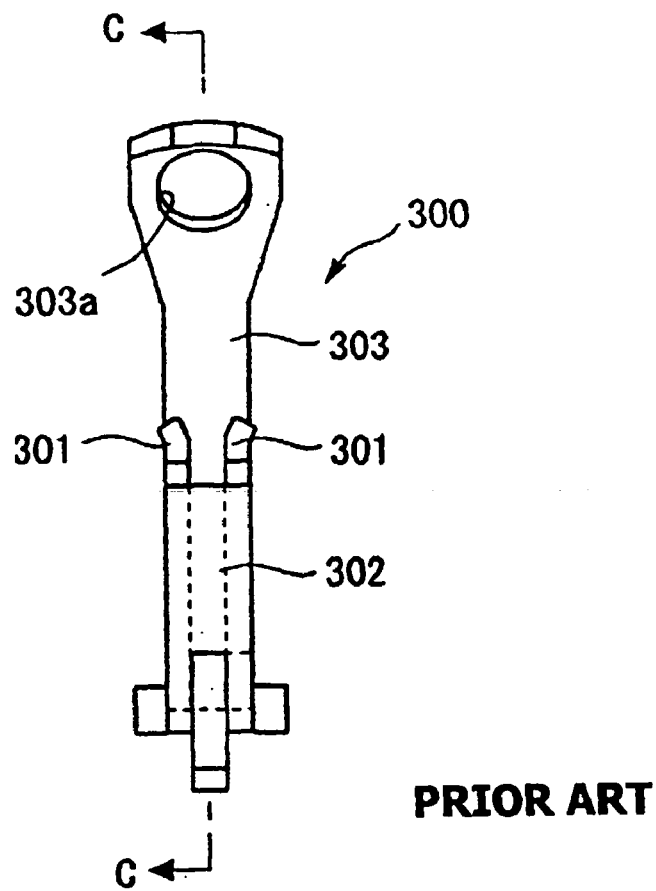
FIG. 13 is a frontal view of a contact to be mounted on the conventional test socket.
Figure 14:
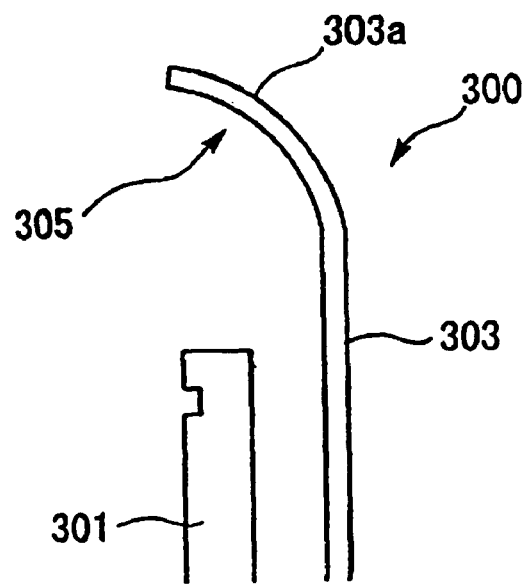
FIG. 14 is a side elevational view of the contact to be mounted on the conventional test socket.
Figure 15:
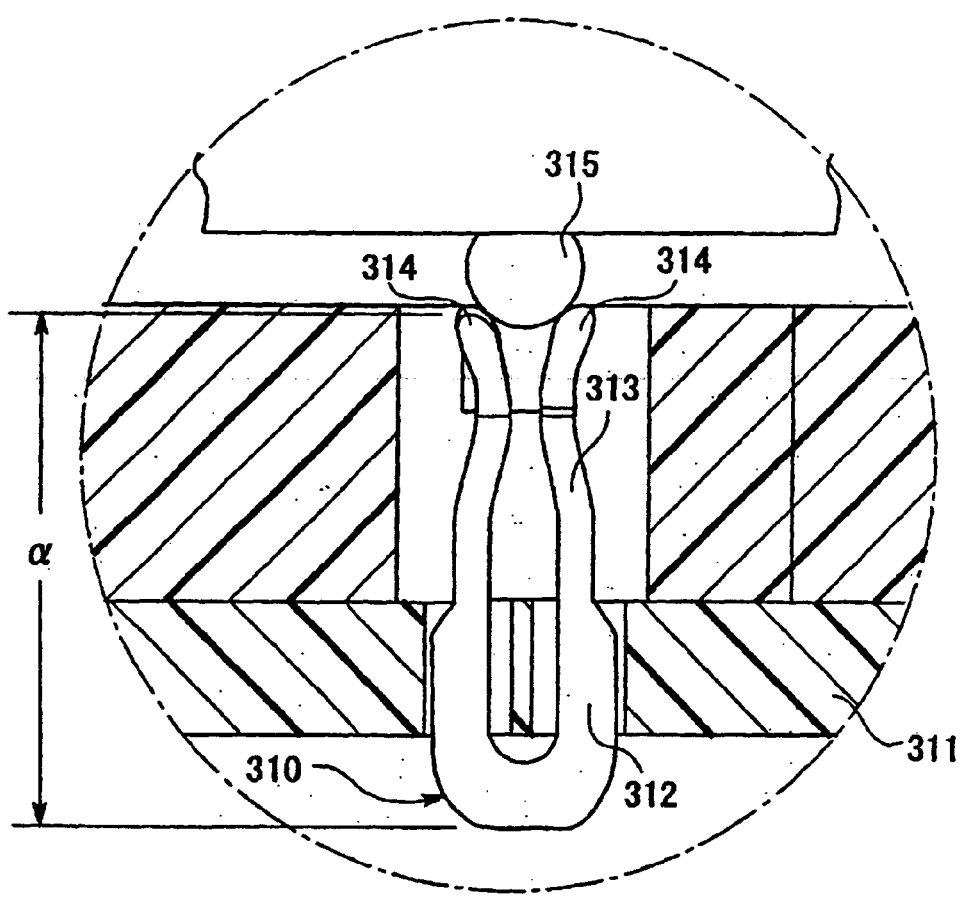
FIG. 15 is a partially enlarged cross-sectional view of the conventional test socket.

FIG. 11 is an enlarged cross-sectional view of a primary portion in accordance with another embodiment of the present invention.

In this embodiment, the shape of the contact 10A is somewhat changed. The structure thereof other than that is basically the same as that of the foregoing embodiment. Therefore, the same reference numerals are used to indicate the same components and the explanation therefor will be omitted.

In the same manner as the contact 10 described above, the contact 10A is provided with the upright piece 101, the support piece 102, the contact portion 103, the proximal end portion 104, the pull-off preventing projections 105 and the U-shaped curved portion 106. In addition, the contact 10A is additionally provided with a reaction piece 108. The reaction piece 108 is formed by bending the contact portion 103 into an inverted U-shape and extending the free end 109 of the upright piece 101 to the inner wall of the through-hole. The free end 109 is set to contact with the inner wall of the through-hole so as to have the reaction force.

When the solder ball S is disposed between the contact portion 103 and the slant surface 141, the contact 10A is elastically deformed as indicated by the dotted lines shown in FIG. 11. In this case, the reactive force of the reaction piece 108 is also added to the reaction force due to the elastic deformation of the upright piece 101 including the U-shaped curved portion 106. Accordingly, in the case where the contact force of the contact with the solder ball S is smaller than the desired contact force, this structure may be adopted.

Incidentally, the present invention is not limited to the BGA type test socket as in the foregoing embodiments but may be applied to any of the sockets of the semiconductor package such as the sockets of CSP (Chip Size Package).

As described above, according to the present invention, the mounting hole of the contact is provided with the through-hole and the support hole, and the contact is provided with the upright piece extending along the through-hole and the support piece extending from the upright piece to be inserted into the support hole. Accordingly, the upright piece is supported to the support piece so that it may be elastically deformed. As a result, it is possible to effectively utilize the full length of the upright piece as a portion that may be elastically deformed. Thus, it is possible to attain the reduction of the self-inductance by the further reduction in height of the socket.

Also, since the upright piece takes a form such that it extends along the through-hole, it is possible to realize a high-density arrangement as compared to the case where the contacts are arranged in a horizontal manner. Also, due to such configuration that the effective spring portion of the contact is elongated, the contact is not inserted into the socket body in its entirety but only the support piece is press-fitted and so on, it is possible to obtain a degree of freedom as to the movement of the upright piece as a whole and to enhance the contact reliability of the contact portion.

Furthermore, since the contact portion and the guide projection are brought into contact with one solder ball and the guide projection is formed in the socket body, the contact itself can be formed of one simple construction, and thus it is possible to reduce the cost.

While a preferred embodiment of the present invention is shown and described, it is envisioned that those skilled in the art may devise various modifications of the present invention without departing from the spirit and scope of the appended claims.

What is claimed is:

1. A socket of a semiconductor package comprising a plurality of contacts to be brought into contact with a plurality of solder balls arranged on one side of the semiconductor package and a socket body in which a plurality of mounting holes are provided for mounting the respective contacts, wherein said mounting hole is provided with a through-hole pierced in a height direction of the socket body and a contact support hole, characterized in that:

each of said contacts is provided with an upright piece extending through the through-hole, a support piece extending from a proximal end side of the upright piece to be inserted into the support hole, the support hole being laterally offset from the through-hole, and a contact portion formed at a free end portion of the upright piece to be brought into contact with the solder ball;

said each contact portion is arranged at a height level such that it projects from the surface of the socket body and a guide projection is provided on the surface of the socket body at a position to face an associated contact portion of each contact; and said contact portion and guide projection are set at an interval such that the solder ball may be brought into contact with both the contact portion and the guide projection.

2. The socket of a semiconductor package according to claim 1, wherein said through-hole is set to a size such that the upright piece may be shifted within its interior.

3. The socket of a semiconductor package according to claim 1, wherein a slant surface having a downward gradient toward the through-hole is formed in the projection.

4. The socket of a semiconductor package according to claim 1, wherein the surface of the contact portion of the contact is formed into a curved surface extending in a direction moving further away from the guide projection.

5. The socket of a semiconductor package according to claim 1, wherein the support piece includes a pull-off preventing projection to be received in the support hole.

6. The socket of a semiconductor package according to claim 1, wherein said socket body is formed into a planar shape, and the contact portion of each extends above a surface of the socket body.

7. The socket of a semiconductor package according to claim 1, wherein the proximal end portion of each contact is arranged on a substrate mounting surface of said socket body, and each proximal end portion projects from the substrate mounting surface.

8. The socket of a semiconductor package according to claim 1, wherein a recess portion having a uniform depth is provided on a surface side of the socket body and the contact portion of each contact is exposed within the recess portion.

9. The socket of a semiconductor package according to claim 1, wherein a U-shaped curved portion is formed between the upright piece and the support piece of the contact.

10. The socket of a semiconductor package according to claim 1, wherein each contact includes a reactive piece extending from the contact portion.

11. A socket of a semiconductor package comprising a plurality of contacts to be brought into contact with a plurality of solder balls arranged on one side of the semiconductor package and a socket body in which a plurality of mounting holes are provided for mounting the respective contacts, wherein said mounting hole is provided with a through-hole pierced in a height direction of the socket body and a contact support hole, characterized in that:

each of said contacts is provided with an upright piece extending through the through-hole, a support piece extending from a proximal end side of the upright piece to be inserted into the support hole, and a contact portion formed at a free end portion of the upright piece to be brought into contact with the solder ball, the support piece includes a pull-off preventing projection to be received in the support hole;

said each contact portion is arranged at a height level such that it projects from the surface of the socket body and a guide projection is provided on the surface of the socket body at a position to face an associated contact portion of each contact; and said contact portion and guide projection are set at an interval such that the solder ball may be brought into contact with both the contact portion and the guide projection.

12. The socket of a semiconductor package according to claim 11, wherein the support hole is laterally offset from the through-hole.

13. The socket of a semiconductor package according to claim 11, wherein a generally U-shaped curved portion is formed between the upright piece and the support piece of the contact.

14. The socket of a semiconductor package according to claim 11, wherein said through-hole is set to a size such that the upright piece may be shifted within its interior.

15. The socket of a semiconductor package according to claim 11, wherein a slant surface having a downward gradient toward the through-hole is formed in the projection.

16. A socket of a semiconductor package comprising a plurality of contacts to be brought into contact with a plurality of solder balls arranged on one side of the semiconductor package and a socket body in which a plurality of mounting holes are provided for mounting the respective contacts, wherein said mounting hole is provided with a through-hole pierced in a height direction of the socket body and a contact support hole, characterized in that:

each of said contacts is provided with an upright piece extending through the through-hole, a support piece extending from a proximal end side of the upright piece to be inserted into the support hole, and a contact portion formed at a free end portion of the upright piece to be brought into contact with the solder ball, wherein a generally U-shaped curved portion is formed between the upright piece and the support piece of the contact;

said each contact portion is arranged at a height level such that it projects from the surface of the socket body and a guide projection is provided on the surface of the socket body at a position to face an associated contact portion of each contact; and said contact portion and guide projection are set at an interval such that the solder ball may be brought into contact with both the contact portion and the guide projection.

17. The socket of a semiconductor package according to claim 16, wherein the support hole is laterally offset from the through-hole.

18. The socket of a semiconductor package according to claim 16, wherein the support hole is laterally offset from the through-hole.

19. The socket of a semiconductor package according to claim 16, wherein said through-hole is set to a size such that the upright piece may be shifted within its interior.

20. The socket of a semiconductor package according to claim 16, wherein a slant surface having a downward gradient toward the through-hole is formed in the projection.

* * * * *